United States Patent [19]

Kim et al.

[11] Patent Number: 4,641,161
[45] Date of Patent: Feb. 3, 1987

[54] HETEROJUNCTION DEVICE

[75] Inventors: Bumman Kim, Richardson; Hua Q. Tserng, Dallas, both of Tex.

[73] Assignee: Texas Instruments Incorporated, Dallas, Tex.

[21] Appl. No.: 656,110

[22] Filed: Sep. 28, 1984

[51] Int. Cl.⁴ .......................................... H01L 29/80
[52] U.S. Cl. ..................................... 357/22; 357/22; 357/23.2; 357/15; 357/16
[58] Field of Search ............... 357/22, 22 M, 22 P, 357/15, 16, 23.2, 22 A, , 22 I

[56] References Cited

U.S. PATENT DOCUMENTS

| | | | |
|---|---|---|---|
| 4,075,651 | 2/1978 | James | 357/16 X |
| 4,075,652 | 2/1978 | Umebachi | 357/16 X |
| 4,236,165 | 11/1980 | Kawashima | 357/16 |
| 4,424,525 | 1/1984 | Mimura | 357/22 X |
| 4,450,462 | 5/1984 | Nuyen | 357/16 X |
| 4,583,105 | 4/1986 | Rosenberg | 357/23.12 |

Primary Examiner—Martin H. Edlow
Attorney, Agent, or Firm—Carlton H. Hoel; James T. Comfort; Melvin Sharp

[57] ABSTRACT

A metal-insulator-semiconductor field effect transistor using an undoped AlGaAs layer as an insulator over an n-type GaAs channel. The high breakdown field of the wide-bandgap AlGaAs results in a very high gate breakdown voltage and a low prebreakdown gate leakage current. The presence of the gate insulator also reduces the gate capacitance, Cgs. Moreover, the electron density in the channel is not all concentrated next to the heterojunction, which means that the series resistance of the channel is low, and also means that channel mobility will not be degraded by a less-than-perfect interface at the heterojunction.

16 Claims, 7 Drawing Figures

HETEROJUNCTION DEVICE

BACKGROUND AND SUMMARY OF THE INVENTION

The present invention relates to microwave semiconductor devices, i.e. to semiconductor active devices capable of switching at frequencies above one GHz.

The present invention more particularly relates to monlithic microwave integrated circuits (MMICs), i.e. to integrated circuits containing many active devices and switching at a clock rate above one GHz.

The present invention also particularly relates to power microwave devices, i.e. to microwave transistors capable of providing an output power greater than 100 microwatts per micron of gate width. The present invention also particularly relates to high-power high-frequency microwave devices, i.e. to microwave transistors capable of providing an output power greater than 100 microwatts per micron of gate width at frequencies above 10 GHz.

The presently most popular microwave transistor technology is MESFET technology. The common features of this technology are that a Schottky-barrier metal is used as the gate in a JFET-like structure. The channel will typically be a lightly doped GaAs semiconductor layer which overlies a semiinsulating substrate. Leakage along the surface from gate to drain is a common problem, and, since reduction of series resistance in the channel is also highly desirable, the gate is commonly recessed. That is, the gate Schottky-barrier metallization is not deposited directly on the surface of the semiconductor, but a recess is etched before the gate is deposited. Preferably the recess is not much wider than the gate, and is etched to (e.g.) one third the depth of the semiconducting layer. This means that the electron population in the channel is slightly removed from the adverse effects of the surface states normally found at the semiconductor surface, and also means that the surface leakage path from gate to drain is longer. However, although this recess etch step is necessary on most MESFET processes. It degrades manufacturability. If the recess etch depth is even slightly nonuniform across a wafer, the pinch-off voltages of the MESFETs on the wafer will vary. This can be disastrous.

Moreover, this technology suffers from several other very important limitations. The output power capability of a MESFET is limited by the gate-drain breakdown voltage and the conduction current through the channel. To improve the breakdown voltage, either a low carrier concentration buffer layer between the gate metal and the channel, or a graded channel approach can be used. See A. Nagashima, S. Umebachi, and G. Kano, *IEEE Trans. Electron Devices*, vol. ED-25, p537, May 1978, which is hereby incorporated by reference. However, since the breakdown voltage is inversely proportional to the product of the doping level and the active layer thickness, i.e., the channel current, see W. R. Frensley, *IEEE Trans. Electron Devices*, vol. ED-28, p962, August 1981, and S. H. Wemple, W. C. Niehaus, H. M., Cox, J., V., Dilorenzo, and W. O. Schlosser, *IEEE Trans. Electron Devices*, vol. ED-27, p1013, June 1980, which is hereby incorporated by reference, the improvement in output power is limited. By employing either an insulating or a semi-insulating buffer layer, the breakdown voltage can be greatly increased due to the much higher breakdown field of the layer, while the current level is maintained. This should result in a device with improved output power. Unfortunately, it has been proved difficult to fabricate metal-insulator-semiconductor or insulated gate FET from III–V compound semiconductors. This is largely due to the large lattice mismatch at the insulator interface and the difficulty in growing a good oxide layer. Even though some attempts have been made in fabricating IGFETs with oxides, see T. Miura and M. Fukuta, *IEEE Electron Devices*, vol. ED-27, p1147, June 1980, which is hereby incorporated by reference, their suitability for microwave power generation has not been demonstrated. Other workers have attempted the use of Ar ion-implantation for the formation of a semi-insulating gate FET (SIGFET), see B. R. Pruniaux, J. C. North, and A. V. Payer, *IEEE Trans. Electron Devices*, vol. ED-19, p672, 1972, which is hereby incorporated by reference, and the use of proton bombardment in the source-drain region for the creation of a MIS structure. See H. M. Macksey, D. W. Shaw, and W. R. Wisseman, *Electronics Letters* vol. 12, p192, 1976, which is hereby incorporated by reference. While the SIGFET approach has resulated in a higher saturated output power, due to the observed higher breakdown voltage, the approach has not been reproducible. It also has inherent higher gate parasitic resistance, which limits its use for high frequency application.

Recently, MIS-type GaAs FETs with AlGaAs as the gate insulator have been reported. See T. J. Drummond et. al., *Electronics Letters*, vol. 19, p 286, 1983, and Y. Katayama, et. al., *Japan. J. of Appl. Phys.* vol. 23, p. 150, 1984, which is hereby incorporated by reference. These devices are referred to (among other names) as HEMTs. The reported device structure has a GaAs channel layer which is either undoped or very lightly doped, under a doped AlGaAs layer. This provides very high channel mobilities, but results in very low current levels and high parasitic resistances. These devices were primarily intended for high-speed digital IC applications, and appear to be inherently unsuitable for any application requiring significant power density.

HEMT devices are extremely sensitive to the quality of the interface between the GaAs and AlGaAs layers. In a HEMT structure, the active carrier population is very narrowly confined to a shallow layer underneath this heterojunction. This means that any degradation in the quality of this interface will drastically degrade the device characteristics. This means that HEMTs are difficult to fabricated, and difficult to fabricated reproducibly.

The present invention teaches a heterojunction transistor having an intrinsic (or nearly so) AlGaAs barrier layer over a moderately or heavily doped GaAs channel layer. In the example of this new GaAs power MISFET structure shown in FIG. 1, a highly doped active GaAs layer was used under an undoped Al(0.5)Ga(0.5)As layer to produce enough conduction current through the channel.

This structure has numerous major advantages over the prior art. First, output power is in general proportional to the operating voltage, which is typically limited by gate breakdown voltage. The present invention improves the gate-drain breakdown, which yields higher operating voltage, and therefore higher power from the same size device. A second advantage is that, for devices operating at the same power, it is preferable to operate in a high voltage regime rather than a high current regime, because this simplifies power supply layout. The device of the present invention could be operated at, for example, 15 volts (with the output impedance- transformed if necessary) as opposed to a prior art MESFET power device which would have to be twice as wide and operated at only eight volts.

A third advantage is that cutoff frquency (or extrapolated cutoff frequency FT) is in general proportional to transconductance g-sub-m over gate source capacitance C-sub-gs; the present invention keept transconductance reasonably good while improving the gate to source capacitance significantly (due to the undoped layer of AlGaAs below the gate), and therefore raises the cutoff frequency.

As far as the band diagram difference between the HEMT and the device of the present invention, the inventive device has a band structure as shown in FIG. 2A, where the left side of the band diagram shows the undoped AlGaAs, and in the middle, at the transition from there to the N+ GaAs, the accumulation region is fairly shallow, so the total amount of charge collected in the small well below the AlGaAs level is going to be relatively small as compared to FIG. 2B, which shows the band structure for the HEMT case. In this case the AlGaAs showsn on the left side is N+, and therefore the potential well at the AlGaAs to GaAs boundary is deep and will collect a great many electrons, and therefore the electron distribution in the HEMT is going to be much more two dimensional than in the device of the present invention. A consequence of the more vertically uniform electron distribution in the device of the present invention is that the quality of the GaAs to AlGaAs interface is less critical. Naturally it is nice if you can fabricate the structure with the extremely high quality GaAs to AlGaAs interface which is required for HEMT device, but for the device of the present invention this is not necessary. That means, for example, that metallorganic CVD can be used to fabricate device of the present invention with (optionally) less stringent requirements on interface quality, or other CVD fabrication may be possible. Interface quality is still important in the device of the present invention, but it is not as important as with a HEMT. In the device of the present invention defects at the interface are likely to induce trapped charge which may screen or partially screen the gate signal from the channel, but in the HEMT gate defects are critically important because they may cause scattering effects which directly and immediately degrade the channel mobility. This effect is not as dangerous in the device of the present invention.

A further advantage of the present invention is that the use of dopants in the AlGaAs, as in the HEMT prior art, well also tend to provide some traps, presumably due to deep levels.

A further modified embodiment of the invention, shown in FIG. 4, is achieved by inserting an additional very thin undoped gallium arsenide layer between the undoped AlGaAs layer and the n type gallium arsenide layer. This additional layer might be, for example, 300 angstroms thick, or within the range of 100 to 500 angstroms thick, or, less preferably, thicker or thinner. In this case, a potential will for electrons will exist at the junction between the AlGaAs and the undoped gallium arsenide layers. Other workers have explored using this potential well alone to provide an operating mode analogous to the operation of the HEMT. However, in this embodiment of the invention, not only does this potential well provide an additional channel, but the N type gallium arsenide also provides a channel. Thus, the total channel current is increased, since two separate regions of conduction are both controlled by the gate. The difference in operating characteristics between this embodiment and the first embodiment is in the forward bias operating characteristics. That is, under reverse bias the small potential well between the undoped AlGaAs and the undoped gallium arsenide will be depleted, and the pinch off characteristics of the N type gallium arsenide channel region will predominate. However, when the gate is forward biased (e.g., at voltages between 0 and around 0.6 volts, where the Schottky barrier starts to conduct under forward bias) the small well between the two undoped layers will be in accumulation, and substantial additional current will be obtained at such biases. Thus, the IV curves of FIG. 3 show that the IV characteristics of the FIG. 2C structure are similar to those of the FIG. 2A structure close to pinch off, but under forward bias substantial additional current will flow at the same voltage levels. This alternative embodiment is particularly applicable to integrated circuits combining both enhancement mode and depletion mode transistors.

Two additional important advantages of the present invention are as follows: First, in conventional MESFET art, it is normally necessary to put the gate in a recess, to minimize surface state effects. However, in the present invention, the undoped AlGaAs layer itself serves to minimize surface leakage as discussed above, so that this recess etch step is not necessary. However, in the most preferred embodiment of the present invention, an N+ GaAs layer is used to assist source and drain contact formation. However, this N+ layer is not necessary. For example, after the patterned N+ source/drain implant was applied, the source and drain metallizations could be deposited directly on the doped portions of the AlGaAs layer, or, alternatively, the AlGaAs layer can be etched away selectively at the contact locations.

A processing advantage of the thin N+ gallium arsenide layer which is most preferably used on top of the AlGaAs layer is that it is easy to use an etch which will etch gallium arsenide and stop on AlGaAs. For example, wet etches containing oxidizing agents will accomplish this, as will plasma etches which preferably include some fraction of an oxidizing GaAs. Thus, this N+ layer can easily be patterned, and the timing of the etching step which patterns it is not critical.

A key problem with the prior art on recess etching and conventional gallium arsenide MESFET structures is that the device characteristics are extremely sensitive to the depth of the recess etch, and therefore the recess etch is a critical parameter. However, it is very difficult to control this etch step so that it is absolutely uniform across the slice. This difficulty is completely avoided by the present invention.

According to the present invention there is provided:
A heterojunction device comprising:
    A channel layer comprising a first semiconductor material and comprising a dopant concentration of at least ten to the 16th per cubic centimeter;
    A barrier layer overlying said channel layer and comprising a second semiconductor material lattice-matched to said first material and having a bandgap wider than the bandgap of said first semiconductor material and comprising a net dopant concentration less than ten to the 16th per cubic centimeter;

First and second source/drain regions electrically connected to said channel layer, and a gate electrode capacitatively coupled to a portion of said channel layer between said source/drain connections.

BRIEF DESCRIPTION OF THE DRAWINGS

The present invention will be described with reference to the accompanying drawings, wherein.

DESCRIPTION OF THE PREFERRED EMBODIMENTS

Figure 1:
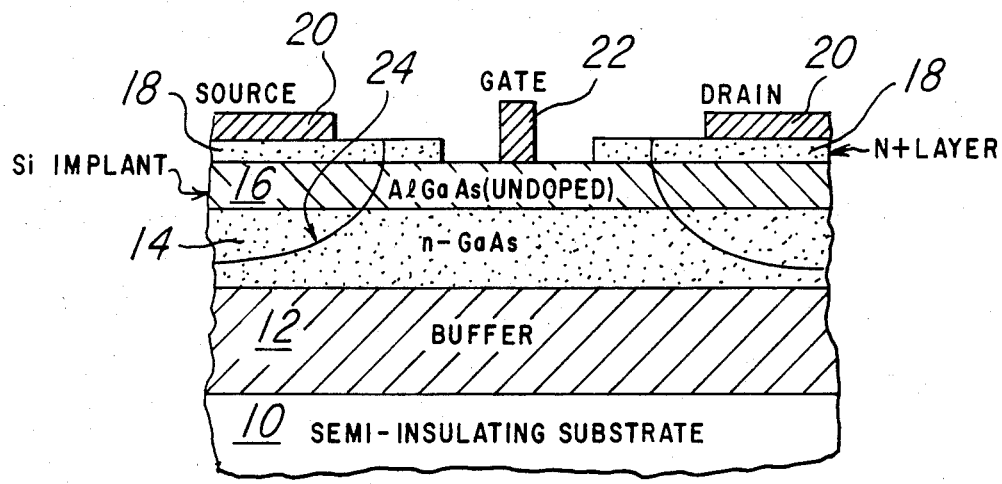
FIG. 1 shows a first sample embodiment of the invention.

In the example of this new GaAs power MISFET structure shown in FIG. 1, a highly doped active GaAs layer 14 was used under the undoped $Al_xGa_{1-x}As$ layer 16 to produce enough conduction current through the channel. The GaAs active layer 14 was 0.1 micron thick with a doping of $3.5 \times 10^{17} cm^{-3}$. The AlAs mole fraction x was selected as 0.5, which results in a band gap of 2 eV in the AlGaAs barrier layer 16 and a low electron mobility (200 cm2/V-sec) for the n-type GaAs channel layer 14. The AlGaAs layer 16 is 0.06 micron, and is lattice matched to the doped GaAs 14 with a good interface. See H. C. Casey, Jr., et. al., J. Appl. Phys. vol. 50, p3484, May 1979, which is hereby incorporated by reference.

The device described above has been fabricated and evaluated. The different layers 14, 16, and 18 were grown sequentially by the molecular beam epitaxy technique on a semi-insulating substrate 10 overlaid by a buffer layer 12. (The buffer layer 12 is provided for physical rather than electronic reasons, i.e. merely because it assists in achieving good epitaxial (MBE) growth of the following layers.) The n+ GaAs layer 18 is provided primarily to assist contact formation, i.e. to ensure low resistance between source/drain metallization 20 and channel layer 14. This thin highly doped layer can also be used for other circuit functions, e.g. it can be used as a resistor or as a capacitor plate, or it can function as a field plate or can be used to provide short interconnects. Preferably a masked implant (e.g. silicon), indicated by diffusion boundaries 24, is used to define source/drain regions and further reduce series resistance.

A sample device constructed in this technology is an inter-digitated FET having 0.6 micron electron-beam defined gates with 4 micron source-drain spacing. The n+ layer 18 was selectively wet etched for the 2 micron opening. A via hole was used for each source pad 20. This device does not require any active layer recess as in the case of conventional MESFETs. The current level is solely controlled by the MBE growth (i.e. by the thickness and doping of layers 14 and 16). Therefore, the current level of the devices can be very uniform. For easy of fabricating the first MISFET device, no n+ ion-implantation 24 through the AlGaAs layer 16 was used for the source and drain ohmic contacts, but the contacts are alloyed directly through the AlGaAs layer 16. This results in relatively high series resistances and saturation voltage.

The transconductance of a 150 micron gate width MISFET is about 87 mmhos/mm, which agrees with the estimated value from the MISFET with a good interface. The I-V curve shows a very linear transfer characteristic, i.e. equal spacings of the drain currents as the gate voltage is stepped in equal increments. Even though the transconductance is lower than that of the conventional MESFET, the reduced gate to source capacitance, Cgs, makes the ratio, gm/Cgs, higher, which will improve the high frequency peformance. The breakdown voltage is very high (19 to 20 volts), with extremely low prebreakdown gate leakage current. The improvement is breakdown voltage using AlGaAs layer 16 increases the maximum output power per unit width.

The microwave characteristics of such a device with a total gatewidth of 750 micron (8 gate fingers) have been evaluated. Even though the device was not fully optimized, excellent microwave performance results at X and lower Ku bands were obtained. A small signal gain of 11 dB has been obtained at 13 GHz. At 10 Ghz, an output power of 630 mW was achieved with 7 dB gain and 37% power-added efficiency. A maximum efficiency of 43% was obtained at 400 mW output (6 dB gain) at 10 Ghz. When operated at 8 GHz with the operating conditions optimized for maximum efficiency, a power-added efficiency of 46% was obrtained at 300 mW output and 7 dB gain.

The present invention has demonstrated for the first time the excellent microwave performance of the GaAs MIS-type power FET using the AlGaAs layer as an insulator. Due to the higher breakdown field of the added AlGaAs layer, a higher carrier concention can be used for the active channel, which will result in an improved power. Since this structure does not require active layer recess, it will also result in more uniform and reproducible devices. We believe that, with further material and channel structure optimizations, this GaAs power MISFET will provide an excellent alternative to the conventional MESFET and may even surpass the microwave performance of the MESFET in terms of output power, efficiency, and frequency.

In the presently preferred embodiment, the gate metal 22 can be a metal such as aluminum or titanium-tungsten or Ti/Pt/Au. The source/drain metallizations 20 can be, for example, gold-germanium/nickel. The buffer layer 12 is preferably undoped gallium arsenide, i.e., gallium arsenide having a net dopant concentration below 10 to the 14 and maybe a micron or two thick. (The buffer layer is provided for physical reasons, as is well known in the art, to achieve good epitaxial layer quality, and is not strictly necessary for electronic functionality.) The substrate 10 is preferably semi-insulating, e.g. chrome doped or intrinsic gallium arsenide.

The present invention can be integrated into gallium arsenide integrated circuits in much the same fashion as conventional MESFET structures are. However, the present invention provides advantages in some areas. For example, if implant-damage isolation is used, the top N+ gallium arsenide layer 18 would be etched away, and the undoped AlGaAs layer 16 which would then be at the surface of the regions adjoining and in the implant damaged isolation would thereby reduce surface leakage, which is the major leakage mode in implant/damaged isolation. In addition, the top N+ gallium arsenide layer 18 can be used for resistor fabrication if desired, as can the thick N type gallium arsenide channel region 14.

Figure 4:
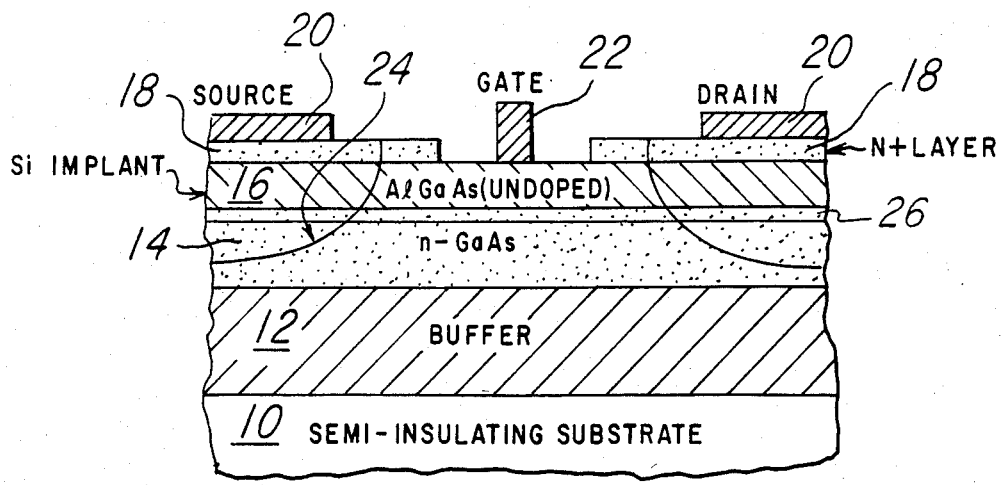
FIG. 4 shows a further modified embodiment of the invention, achieved by inserting an additional very thin undoped gallium arsenide layer between the undoped AlGaAs layer and the n type gallium arsenide layer.
Figure 2A:
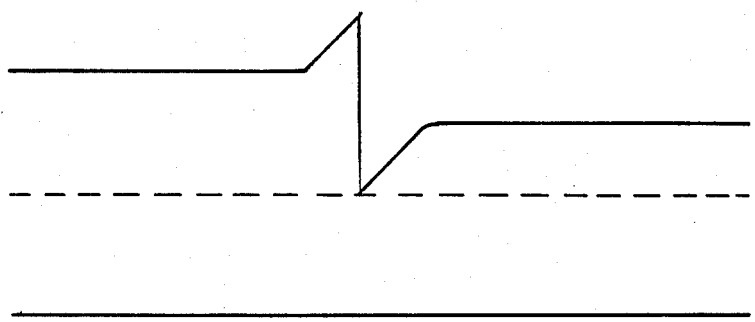
FIG. 2 shows approximate band diagrams, along a vertical line through the gate and channel, for the device of FIG. 1, for a conventional HEMT device, and for the alternative inventive embodiment of FIG. 4.
Figure 2B:
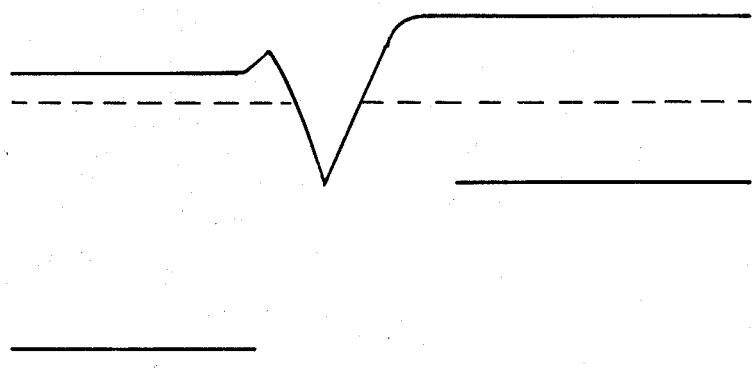
Figure 2C:
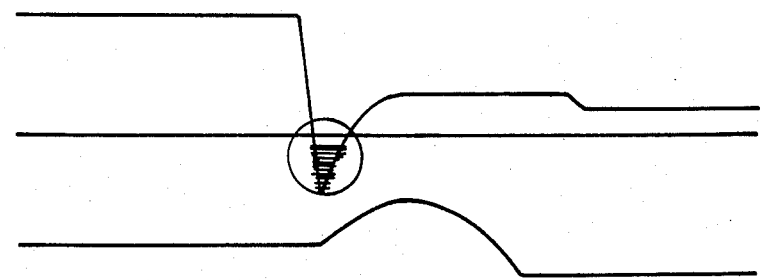
Figure 3A:
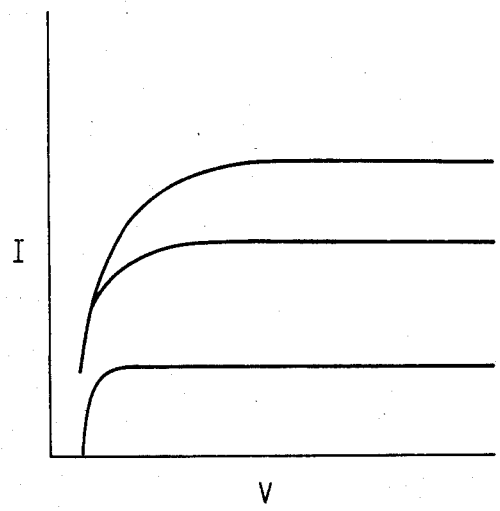
FIG. 3 shows approximate I-V curves for the devices of FIG. 1 and of FIG. 4.
Figure 3B:
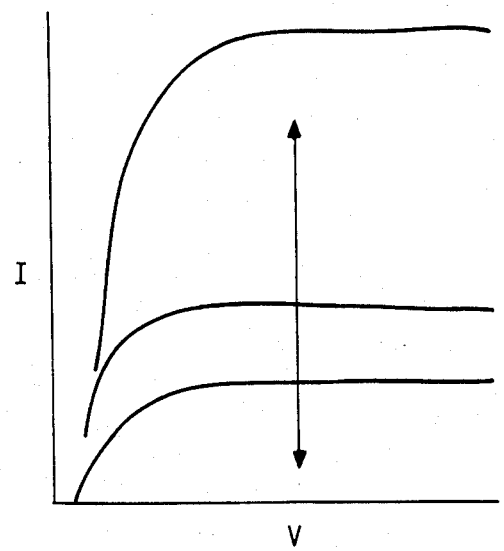

A further modified embodiment of the invention, shown in FIG. 4, is achieved by inserting an additional very thin undoped gallium arsenide layer 26 between the undoped AlGaAs layer 16 and the n type gallium arsenide layer 14. This additional layer 26 might be, for example, 300 angstroms thick, or within the range of 100 to 500 angstroms thick, or, less preferably, thicker or thinner. In this case, a potential well for electrons will exist at the junction between the AlGaAs 16 and the undoped gallium arsenide layer 26. Other workers have explored using this potential well alone to provide an operating mode analogous to the operating of the HEMT. However, in this embodiment of the invention, not only does this potential well provide an additional channel, but the N type gallium arsenide 14 also provides a channel. Thus, the total channel current is increased, since two separate regions of conduction are both controlled by the gate. The difference in operating characteristics between this embodiment and the first embodiment is in the forward bias operating characteristics. That is, under reverse bias the small potential well between the undoped AlGaAs and the undoped gallium arsenide will be depleted, and the pinch off characteristics of the N type gallium arsenide channel region will predominate. However, when the gate is forward biased (e.g., at voltages between 0 and around 0.6 volts, where the Schottky barrier starts to conduct under forward bias) the small well between the two undoped layers will be in accumulation, and substantial additional current will be obtained at such biases. Thus, the IV curves of FIG. 3 show that the IV characteristics of the FIG. 2C structure are similar to those of the FIG. 2A structure close to pinch off, but under forward bias substantial additional current will flow at the same voltage levels. This alternative embodiment is particularly applicable to integrated circuits combining both enhancement mode and depletion mode transistors.

The barrier layer 16 is about 600 Angstroms thick in the presently preferred embodiment, and generally is preferably between 200 and 2000 Angstroms thick, but may optionally be as thin as 100 Angstroms (or even less) or as thick as 3000 Angstroms. The product of thickness and doping for channel layer 14 is preferably comparable to that found in the MESFET prior art, but the present invention permits use of quite a high channel doping. Alternatively, the present invention also permits use of higher doping thickness products than those found in the MESFET prior art, since the resultling higher pinchoff voltage characteristics are accommodated by the higher gate breakdown voltages. Channel layer 14 is preferably between 1000 and 2000 Angstroms thick for X-band operation, but may be thinner for higher frequencies: it may be as thin as 300 Angstroms (or even less), or alternatively as thick as one-half micron. The most preferred doping level for layer 14 is between one and ten times ten to the 17 per cc, but lower doping levels may be used. The channel doping level must be at least 1E16, and should preferably be much higher than this, to minimize series resistance.

The principal preferred embodiment uses Al(0.5)Ga(0.5)As for the barrier layer, but of course other AlGaAs alloys, having other bandgaps, could be used instead. It is not even necessary to rely on the GaAs/AlGaAs system: other lattice-matched heterojunction systems could be used instead. It is preferred that the difference in bandgap between the channel layer 14 and the barrier layer 16 be at least 0.3 eV, but this could optionally be as little as 0.1 eV. As the bandgap difference between these two materials is made smaller, the device of the present invention tends to behave more like prior art MESFET devices.

The key advantages of the present invention as compared to the HEMT device are: The present invention provides more power (and also more current, and also more voltage) than a HEMT device for the same size device. Therefore, the device of the present invention does have the capability to generate much more power than the HEMT device.

An additional advantage over the HEMT art is simpler fabrication. Since the GaAs to AlGaAs interface is less critical in the present invention, more processing latitude is obviously available.

As opposed to conventional MESFET devices, the key advantages of the present invention are: improved uniformity across the slice, since depth of recess etch is no longer a relevant parameter; second, the device of the present invention can operate at much higher voltages than conventional MESFETs, for given doping and thickness parameters, and therefore can achieve greater power for unit gate width for equivalent parameters.

In addition, the modified embodiment of the present invention, which has an undoped gallium arsenide layer interposed between the undoped AlGaAs layer and the N type gallium arsenide layer, has the additional advantage over conventional MESFET art of increased current capability, due to conduction in the potential well between the two undoped layers.

Thus, the present invention teaches a metal-insulator-semiconductor field effect transistor using an undoped AlGaAs layer as an insulator over an n-type GaAs channel. Due to the higher breakdown field of the wide-bandgap AlGaAs, the gate breakdown voltage has been greatly improved as compared with a conventional GaAs MESFET. The prebreakdown gate leakage current of this new device structure is also much lower than that of the MESFET. The presence of the gate insulator also reduces the gate capacitance, Cgs. Moreover, the electron density in the channel is not all concentrated next to the heterojunction, which means that the series resistance of the channel is low, and also means that channel mobility will not be degraded by a less-than-perfect interface at the heterojunction. All these factors result in a GaAs power FET structure with potentials for high power, efficiency, and frequency of operation. An unoptimized 750 micron gate width device achieved an output power of 630 mw with 7 dB gain and 37% power-added efficiency at 10 GHz. At reduced output power levels, power-added efficiency as high as 46% was obtained at X band.

The present invention has been described with primary reference to a heterojunction system wherein AlGaAs and GaAs are used as a lattice-matched pair of semiconductors having different band gaps. However, the present invention can also be embodied using any other lattice-matched heterojunction semiconductor system, such as InP/GaInAsP, CdTe/HgCdTe, or many others well known. See Pankove, Optical processes in semiconductors, which is hereby incorporated by reference.

As will be apparent to those skilled in the art, the present invention provides fundamental novelty in the art of microwave devices, and its scope is accordingly not limited except as specified in the accompanying claims.

What is claimed is:

1. A heterojunction device comprising:
a channel layer comprising a first semiconductor material and comprising a dopant concentration of at least ten to the 16th per cubic centimeter;
a barrier layer overlying said channel layer and comprising a second semiconductor material lattice-matched to said first material and having a bandgap wider than the bandgap of said first semiconductor material and comprising a net dopant concentration less than ten to the 16th per cubic centimeter and of thickenss inhibiting carrier tunneling; and
first and second source/drain contacts electrically connected to said channel layer, and a gate electrode capacitatively coupled to a portion of said channel layer between said source/drain connections.

2. The device of claim 1, wherein:
said barrier layer is roughly 600 angstroms thick;
said second semiconductor material has a bandgap which is at least 0.3 eV wideer than the bandgap of said first semiconductor material; and
said gate electrode comprises a strip of metal forming a Schottky barrier contact to said barrier layer.

3. A heterojunction device comprising:
a channel layer comprising a first semiconductor material and comprising a dopant concentration of at least ten to the 16th per cubic centimeter;
a barrier layer overlying said channel layer and comprising a second semiconductor material attice-matched to said first material and having a bandgap wider than the bandgap of said first semiconductor material and comprising a net dopant concentration less than ten to the 16th per cubic centimeter;
first and second source/drain contacts electrically connected to said channel layer, and a gate electrode abutting said barrier layer and capacitatively coupled to a portion of said channel layer between said source/drain connections.

4. The device of claim 3, wherein said second semiconductor material has a bandgap which is at least 0.3 eV wider than the bandgap of said first semiconductor material.

5. The device of claim 3, wherein said channel layer has a net dopant concentration greater than ten to the 17 per cc.

6. The device of claim 3, wherein said barrier layer is locally degenerately doped above portions of said source/drain regions to make said connection between said source/drain contacts and said channel layer.

7. The device of claim 3 wherein said barrier layer is less than 2000 Angstroms thick.

8. The device of claim 3, wherein said gate electrode comprises a strip of metal forming a Schottky barrier contact to said barrier layer.

9. The device of claim 3, further comprising an additional layer of said first material interposed between said channel layer and said barrier layer.

10. A heterojunction device comprising:
a channel layer comprising a first semiconductor material and comprising a dopant concentration of at least ten to the 16th per cubic centimeter;
an intermediate layer overlying said channel layer and also comprising said first material and comprising a net dopant concentration less than one third of the net dopant concentration of said channel layer;
a barrier layer overlying said intermediate layer and comprising a second semiconductor material lattice-matched to said first material and having a bandgap wider than the bandgap of said first semiconductor material and comprising a net dopant concentration less than ten to the 16th per cubic centimeter;
first and second source/drain contacts electrically connected to said channel layer, and a gate electrode capacitatively coupled to a portion of said channel layer between said source/drain connections.

11. The device of claim 10, wherein said second semiconductor material has a bandgap which is at least 0.3 eV wider than the bandgap of said first semiconductor material.

12. The device of claim 10, wherein said channel layer has a net dopant concentration greater than ten to the 17 per cc.

13. The device of claim 10, wherein said barrier layer is locally degenerately doped above portions of said source/drain regions to make said connection between said source/drain contacts and said channel layer.

14. The device of claim 10 wherein said barrier layer is less than 2000 Angstroms thick.

15. The device of claim 10, wherein said intermediate layer is less than 500 Angstroms thick.

16. The device of claim 10, wherein said gate electrode comprises a strip of metal forming a Schottky barrier contact to said barrier layer.

* * * * *